(12) United States Patent
Umeda et al.

(10) Patent No.: US 8,884,619 B2
(45) Date of Patent: Nov. 11, 2014

(54) MAGNETIC RESONANCE IMAGING APPARATUS AND MAGNETIC RESONANCE IMAGING METHOD

(75) Inventors: Masaaki Umeda, Sakura (JP); Kazuyuki Soejima, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 834 days.

(21) Appl. No.: 12/792,018

(22) Filed: Jun. 2, 2010

(65) Prior Publication Data

US 2010/0308819 A1    Dec. 9, 2010

(30) Foreign Application Priority Data

Jun. 4, 2009 (JP) .................................. 2009/135100
May 14, 2010 (JP) .................................. 2010/112166

(51) Int. Cl.
*G01R 33/56* (2006.01)
*G01R 33/36* (2006.01)
*G01R 33/565* (2006.01)

(52) U.S. Cl.
CPC ........ *G01R 33/3607* (2013.01); *G01R 33/5659* (2013.01)
USPC .............................. 324/318; 324/307; 324/309

(58) Field of Classification Search
CPC ............................. G01R 33/0041; G01R 33/07
USPC ............................ 324/300–322; 600/407–464
See application file for complete search history.

(56) References Cited

U.S. PATENT DOCUMENTS

| 4,868,501 | A  | * | 9/1989 | Conolly ......................... | 324/309 |
| 6,294,913 | B1 | * | 9/2001 | Hinks et al. .................... | 324/309 |
| 7,218,113 | B2 | * | 5/2007 | Feiweier et al. ............... | 324/320 |
| 8,436,617 | B2 | * | 5/2013 | Renz et al. ..................... | 324/322 |
| 8,487,614 | B2 | * | 7/2013 | Kamata .......................... | 324/307 |
| 2005/0134268 | A1 | * | 6/2005 | Zhu .............................. | 324/309 |
| 2009/0128150 | A1 | * | 5/2009 | Ham et al. ..................... | 324/318 |

FOREIGN PATENT DOCUMENTS

| JP | 04-327834    |   | 11/1992 |           |
|----|--------------|---|---------|-----------|
| JP | 04-327834  I | * | 11/1992 |           |
| JP | 06-319716    | * | 11/1994 | ............. A61B 5/055 |
| JP | 07-323016    |   | 12/1995 |           |
| JP | 2005-021690  |   | 1/2005  |           |
| JP | 2006-153461  |   | 6/2006  |           |

OTHER PUBLICATIONS

JP Office Action dated Dec. 17, 2013 in JP 2010-112166.

* cited by examiner

*Primary Examiner* — Melissa Koval
*Assistant Examiner* — Emily Chan
(74) *Attorney, Agent, or Firm* — Nixon & Vanderhye PC

(57) ABSTRACT

According to one embodiment, a magnetic resonance imaging apparatus includes an acquiring unit and a generating unit. The acquiring unit performs compensation of a control waveform of a radio-frequency wave based on "an output waveform of a radio-frequency wave from an amplifier before the compensation" so that an intended output waveform of a radio-frequency wave for generating a spatially non-selective radio-frequency magnetic field is outputted from the amplifier, and acquires a magnetic resonance signal using the control waveform of a radio-frequency wave after the compensation. The generating unit generates image data based on the magnetic resonance signal.

14 Claims, 8 Drawing Sheets

MAGNETIC RESONANCE IMAGING APPARATUS AND MAGNETIC RESONANCE IMAGING METHOD

CROSS-REFERENCE TO RELATED APPLICATION(S)

This application is based upon and claims the benefit of priority from Japanese Patent Application No. 2009-135100 filed on Jun. 4, 2009 and Japanese Patent Application No. 2010-112166 filed on May 14, 2010, the entire contents of which are incorporated herein by reference.

BACKGROUND OF THE INVENTION

1. Field of the Invention

Embodiments described herein relate generally to MRI (magnetic resonance imaging) which magnetically excites nuclear spin of an object with an RF (radio frequency) signal having the Larmor frequency and reconstructs an image based on NMR (nuclear magnetic resonance) signals generated due to the excitation.

Embodiments described herein also relate generally to technology for generating an intended RF output waveform in a magnetic resonance imaging apparatus and a magnetic resonance imaging method.

2. Description of the Related Art

Magnetic Resonance Imaging is an imaging method which magnetically excites nuclear spin of an object set in a static magnetic field with an RF signal having the Larmor frequency and reconstructs an image based on NMR signals generated due to the excitation.

In the field of magnetic resonance imaging, technology of controlling a waveform of an RF transmission pulse is known. For example, a VFA (variable flip angle) method is known as technology for making a refocusing angle of an FSE (fast spin echo) sequence variable (for example, refer to Japanese Publication of Patent Application No. 2005-21690 and Japanese Patent No. 3405813). According to the VFA method, not only contrast of an image can be improved by adjusting a refocusing angle and thereby inhibiting blur, but also SAR (specific absorption rate) can be decreased. Note that SAR is a reference value showing accumulated energy amount in an object caused by a magnetic field.

In addition, a VERSE (variable rate selective excitation) method is known as technology of transforming a waveform of an RF transmission pulse. Moreover, a tag pulse which controls a waveform of an RF transmission pulse is known.

However, an RF amplifier overshoots or undershoots failing in generating a predetermined waveform of an RF transmission pulse precisely in some cases, when imaging is performed under a pulse sequence including an RF transmission pulse with a drastic gradient (slope) such as a square-wave pulse like a pulse sequence using the VFA method, the VERSE method or the tag pulse. Therefore, technology of generating an intended waveform of an RF output pulse steadily is demanded, when imaging is performed under application of an RF transmission pulse whose intensity changes rapidly.

DESCRIPTION OF THE PREFERRED EMBODIMENTS

The following embodiments aim to provide MRI technology which can generate an intended waveform of an RF output pulse more stably than the conventional art, but the present invention is not limited to this aim.

According to one embodiment, a magnetic resonance imaging apparatus includes an acquiring unit and a generating unit. The acquiring unit performs compensation of a control waveform of a radio-frequency wave based on an output waveform of a radio-frequency wave from an amplifier before the compensation so that an intended output waveform of a radio-frequency wave for generating a spatially non-selective radio-frequency magnetic field is outputted from the amplifier, and acquires a magnetic resonance signal using the control waveform of a radio-frequency wave after the compensation. The generating unit generates image data based on the magnetic resonance signal.

According to one embodiment, a magnetic resonance imaging method includes the steps of:

(a) performing compensation of a control waveform of a radio-frequency wave based on an output waveform of a radio-frequency wave from an amplifier before the compensation so that an intended output waveform of a radio-frequency wave for generating a spatially non-selective radio-frequency magnetic field is outputted from the amplifier;

(b) acquiring a magnetic resonance signal using the control waveform of a radio-frequency wave after the compensation; and (c) generating image data based on the magnetic resonance signal.

A magnetic resonance imaging apparatus and a magnetic resonance imaging method according to embodiments of the present invention will be described with reference to the accompanying drawings.

(Configuration and Function)

Figure 1:
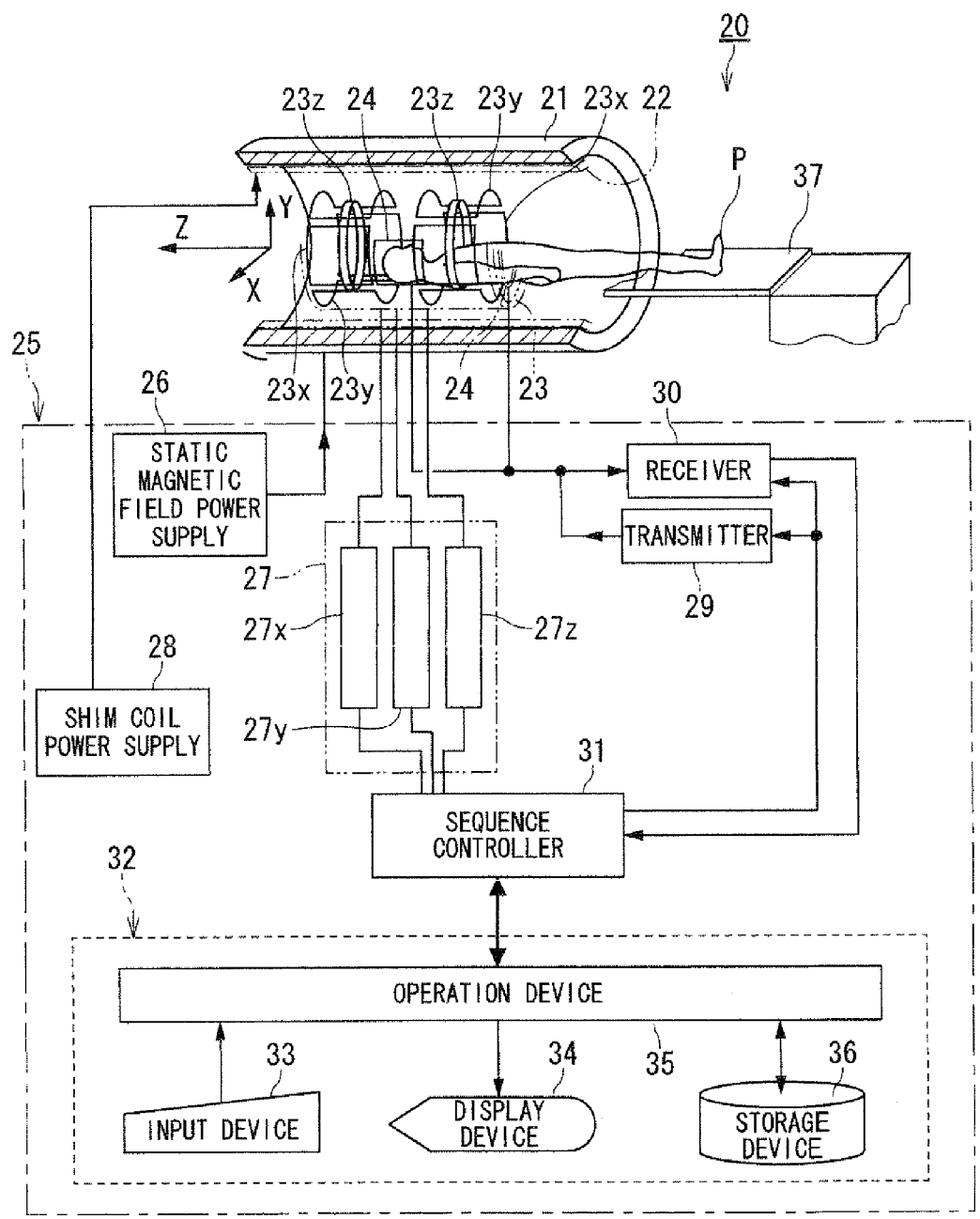
FIG. 1 is a block diagram showing a magnetic resonance imaging apparatus according to one embodiment.

FIG. 1 is a block diagram showing a magnetic resonance imaging apparatus according to an embodiment of the present invention.

A magnetic resonance imaging apparatus 20 includes a cylinder-shaped static magnetic field magnet 21 for generating a static magnetic field, a cylinder-shaped shim coil 22 arranged inside the static magnetic field magnet 21, a gradient coil 23 and RF coils 24.

The magnetic resonance imaging apparatus 20 also includes a control system 25. The control system 25 includes a static magnetic field power supply 26, a gradient magnetic field power supply 27, a shim coil power supply 28, a transmitter 29, a receiver 30, a sequence controller 31 and a computer 32. The gradient magnetic field power supply 27 of the control system 25 includes an X-axis gradient magnetic field power supply 27x, a Y-axis gradient magnetic field power supply 27y and a Z-axis gradient magnetic field power supply 27z. The computer 32 includes an input device 33, a display device 34, a operation device 35 and a storage device 36.

The static magnetic field magnet 21 is electrically connected to the static magnetic field power supply 26 and has a function to generate a static magnetic field in an imaging region by using electric current supplied from the static magnetic field power supply 26. The static magnetic field magnet 21 includes a superconductivity coil in many cases. The static magnetic field magnet 21 gets electric current from the static magnetic field power supply 26 which is electrically connected to the static magnetic field magnet 21 at excitation. However, once excitation has been made, the static magnetic field magnet 21 is usually isolated from the static magnetic field power supply 26. The static magnetic field magnet 21 may include a permanent magnet which makes the static magnetic field power supply 26 unnecessary.

The cylinder-shaped shim coil 22 is coaxially arranged inside the static magnetic field magnet 21. The shim coil 22 is electrically connected to the shim coil power supply 28. The shim coil power supply 28 supplies electric current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z is cylinder-shaped and arranged inside the static magnetic field magnet 21. A bed 37 is arranged inside the gradient coil 23 and the area inside the gradient coil 23 is an imaging area. The bed 37 supports an object (e.g. a patient) P. The RF coils 24 include a WBC (whole body coil) built in the gantry for transmission and reception of RP signals and local coils arranged around the bed 37 or the object P for reception of RP signals.

The gradient coil 23 is electrically connected to the gradient magnetic field power supply 27. The X-axis gradient coil 23x, the Y-axis gradient coil 23y and the Z-axis gradient coil 23z of the gradient coil 23 are electrically connected to the X-axis gradient magnetic field power supply 27x, the Y-axis gradient magnetic field power supply 27y and the Z-axis gradient magnetic field power supply 27z of the gradient magnetic field power supply 27 respectively.

The X-axis gradient magnetic field power supply 27x, the Y-axis gradient magnetic field power supply 27y and the Z-axis gradient magnetic field power supply 27z supply electric current to the X-axis gradient coil 23x, the Y-axis gradient coil 23y and the Z-axis gradient coil 23z respectively so as to generate a gradient magnetic field Gx in the X-axis direction, a gradient magnetic field Gy in the Y-axis direction and a gradient magnetic field Gz in the Z-axis direction in the imaging area.

The RF coils 24 are electrically connected to the transmitter 29 and/or the receiver 30. The transmission RF coil 24 has a function to transmit a RF signal given from the transmitter 29 to the object P. The reception RF coil 24 has a function to receive an NMR signal generated due to excited nuclear spin inside the object P by the RF signal and give the received NMR signal to the receiver 30.

The sequence controller 31 of the control system 25 is electrically connected to the gradient magnetic field power supply 27, the transmitter 29 and the receiver 30. The sequence controller 31 has a function to storage sequence information describing control information needed in order to make the gradient magnetic field power supply 27, the transmitter 29 and the receiver 30 drive. The aforementioned control information includes motion control information, such as intensity, impression period and impression timing of the pulse electric current which should be impressed to the gradient magnetic field power supply 27. The sequence controller 31 also has a function to generate gradient magnetic fields Gx, Gy and Gz in the X-axis, Y-axis and Z-axis directions and RF signals by driving the gradient magnetic field power supply 27, the transmitter 29 and the receiver 30 according to a predetermined sequence stored.

The sequence controller 31 is also configured to receive raw data, which are complex data obtained through the detection of an NMR signal and A/D conversion to the NMR signal detected in the receiver 30, and input the raw data to the computer 32.

Therefore, the transmitter 29 has a function to give an RF signal to the transmission RF coil 24 in accordance with the control information provided from the sequence controller 31. The receiver 30 has a function to generate raw data which are digitized complex number data obtained by detecting an NMR signal given from the reception RF coil 24, performing predetermined signal processing to the NMR signal detected, and performing A/D conversion to the NMR signal after the predetermined signal processing. The receiver 30 also has a function to give the generated raw data to the sequence controller 31.

The computer 32 obtains various functions by the operation device 35 executing some programs stored in the storage device 36 of the computer 32. Alternatively, some specific circuits having various functions may be provided with the magnetic resonance imaging apparatus 20 instead of using some of the programs.

Figure 2:
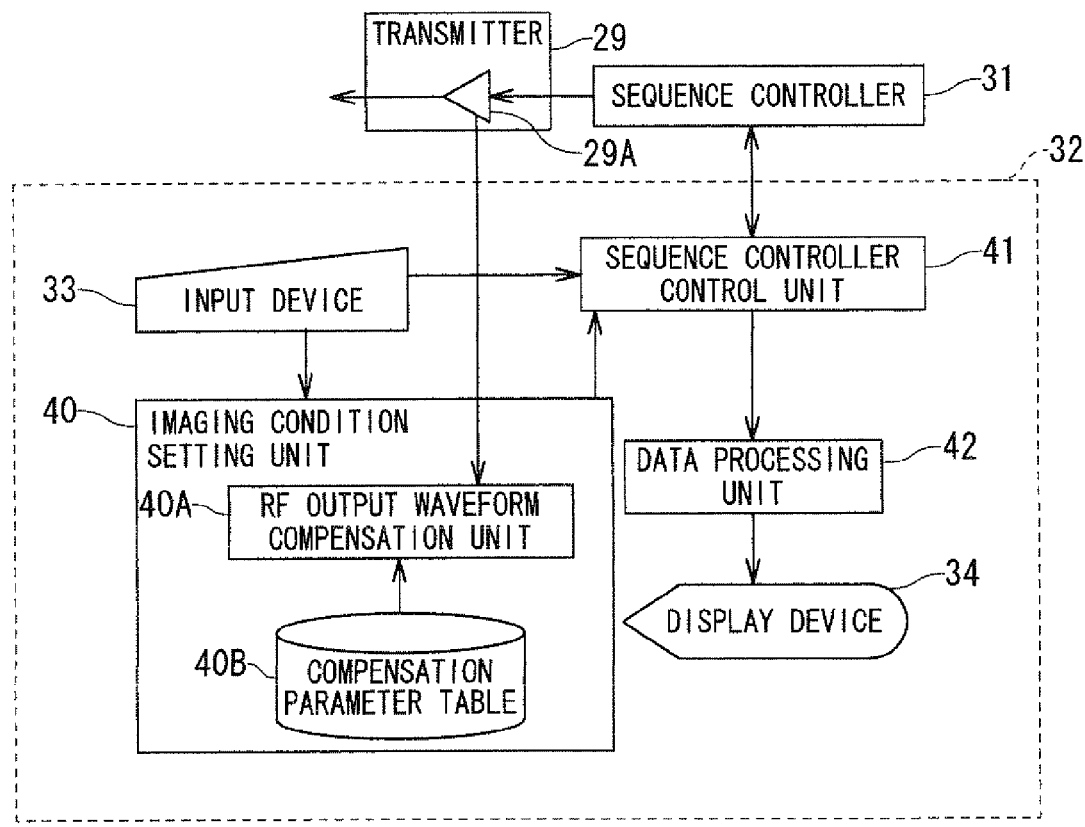
FIG. 2 is a functional block diagram of the computer 32 shown in FIG. 1.

FIG. 2 is a functional block diagram of the computer 32 shown in FIG. 1.

The computer 32 functions as an imaging condition setting unit 40, a sequence controller control unit 41 and a data processing unit 42. The imaging condition setting unit 40 includes an RF output waveform compensation unit 40A and a compensation parameter table 40B.

The imaging condition setting unit 40 has a function to set imaging conditions including a pulse sequence based on instructions from the input device 33 and to provide the set imaging conditions to the sequence controller control unit 41. The RF output waveform compensation unit 40A has a function of compensating a waveform of an RF pulse of a pulse sequence set as an imaging condition based on an RF output waveform, which the RF amplifier 29A of the transmitter 29 has actually outputted using the RF control waveform generated in the computer 32 as an input waveform.

FIGS. 3A-D are concept charts showing examples of an RF input waveform to the RF amplifier 29A, an RF output waveform from the RF amplifier 29A corresponding to the RF input waveform, a compensated RE input waveform to the RF amplifier 29A, and an RF output waveform from the RF amplifier 29A corresponding to the compensated RF input waveform.

In FIG. 3 (A), (B), (C), (D), each abscissa axis indicates time and each vertical axis indicates signal intensity (amplitude) of an RF pulse.

Additionally, FIG. 3 (A) indicates an RF input waveform I(t) to the RF amplifier 29A before compensation. FIG. 3 (B) indicates an RF output waveform O(t) from the RF amplifier 29A corresponding to the RF input waveform I(t). FIG. 3 (C) indicates a compensated RF input waveform I'(t) to the RF amplifier 29A. FIG. 3 (D) indicates an RF output waveform O'(t) from the RF amplifier 29A corresponding to the compensated RF input waveform I'(t).

The RF output waveform from the RF amplifier 29A corresponding to the RF control waveform generated in the computer 32 can be acquired by performing a prescan prior to an imaging scan in advance. For example, as shown in FIG. 3 (A), a spatially non-selective square-wave pulse is generated in the imaging condition setting unit 40 as the RF control waveform, and this square-wave pulse is inputted to the RF amplifier 29A of the transmitter 29 through the sequence controller control unit 41 and the sequence controller 31. The RF amplifier 29A outputs the RF output waveform O(t) shown in FIG. 3 (B) using the square-wave pulse shown in FIG. 3 (A) as the RF input waveform I(t). The compensation unit 40A is configured to provide a function of monitoring this RF output waveform O(t).

In the actually observed RF output waveform O(t), overshoot or undershoot occurs as shown in FIG. 3 (B) according to the performance of the RF amplifier 29A and the amplitude of the RF input waveform I(t) inputted to the RF amplifier 29A.

Then, the RF output waveform compensation unit 40A has a function of compensating the RF input waveform for the imaging scan based on the RF input waveform I(t) and the RF output waveform O(t).

Next, methods of compensating the RF input waveform will be explained. The relationship between the RF input waveform I(t) to the RF amplifier 29A before compensation and the RF output waveform O(t) before compensation is described as equation (1) with the use of a response function h(t).

$$h(t)=O(t)/I(t); \quad (1)$$

Thus, in order for the RF amplifier 29A to output the same waveform as the RF input waveform I(t) before compensation, (t)/h(t) should be the compensated RF input waveform I'(t) as shown in equation (2).

$$I'(t)=I(t)/h(t); \quad (2)$$

The RF input waveform I'(t) after compensation determined by the equation (2) becomes the waveform as shown in FIG. 3 (C). Additionally, if the RF input waveform I'(t) after compensation shown in FIG. 3 (C) is inputted to the RF amplifier 29A, the ideal square-wave pulse shown in FIG. 3 (D) is outputted as the RF output waveform O'(t).

Note that, even if the compensated RF input waveform I'(t) calculated by the equation (2) is inputted to the RF amplifier 29A, the ideal RF output waveform is not outputted in some cases due to insufficient compensation depending on the performance of the RF amplifier 29A and the amplitude of the RF input waveform I'(t).

Then, h'(t) is defined by using the RF output waveform O'(t) which is outputted as a response to the RF input waveform I'(t) compensated by the equation (2).

The h'(t) is acquired by dividing O'(t) by I'(t), i.e. h'(t)=O'(t)/I'(t).

Next, the compensated RF input waveform I''(t) can be determined under the following equation (3) using the response function h'(t).

$$I''(t)=I'(t)/h'(t); \quad (3)$$

In other words, when the RF input waveform is not sufficiently compensated through only one correction, the RF input waveform is corrected two times or more with the use of the response function.

Compensation of the RF input waveform to the RF amplifier 29A can be executed by performing a prescan for each imaging scan in advance and monitoring the RF output waveform in each prescan. Note that the RF output waveform can be monitored in the prescan for measuring the reception gain of the RF amplifier 29A.

Signal intensity of an input signal component, which actually causes overshoot to the RF amplifier 29A, is not linear but nonlinear.

Figure 4:
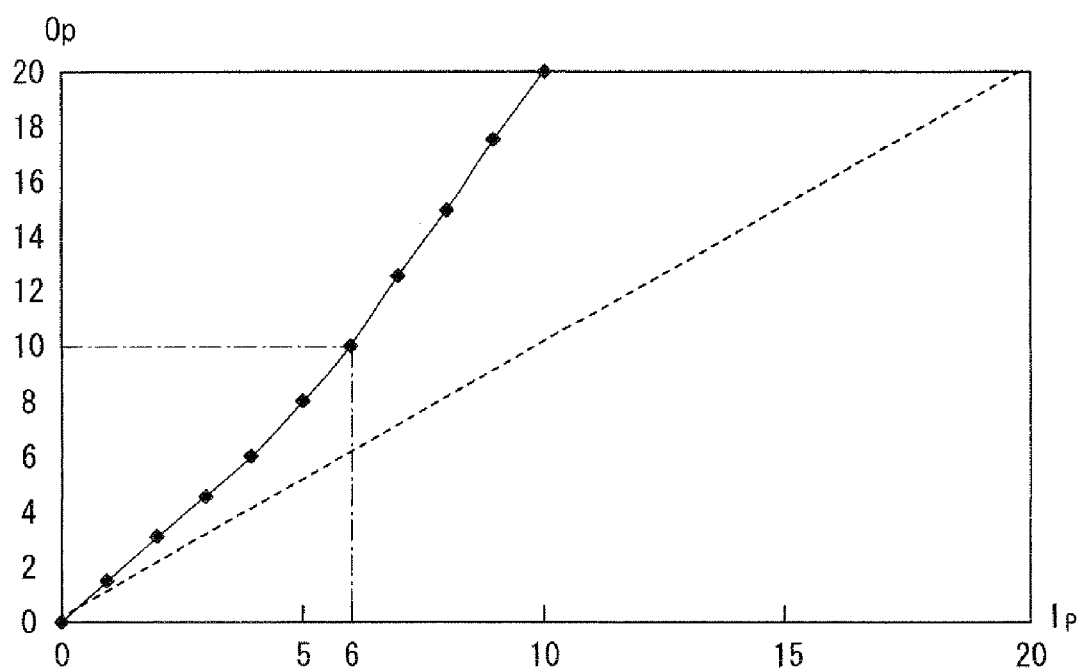
FIG. 4 is a chart showing nonlinearity of the RF input waveform corresponding to an overshoot component in the RF output waveform outputted from an RF amplifier.

FIG. 4 is a chart showing nonlinearity of the RF input waveform, which is one of the causes of the overshoot component in the RF output waveform outputted from the RF amplifier 29A.

In FIG. 4, the abscissa axis indicates power Ip(KW) of an RF transmission pulse inputted to the RF amplifier 29A, and the vertical axis indicates peak power Op(kW) of the RF transmission pulse outputted from the amplifier 29A as a response to the RF transmission pulse.

As shown in FIG. 4, the power Ip of the RF transmission pulse inputted to the RF amplifier 29A is nonlinear to the peak Op of the power of the RF transmission pulse outputted from the RF amplifier 29A. Thus, it is desirable in terms of accuracy to perform compensation of the RF input waveform to the RE amplifier 29A considering a nonlinear term. This nonlinear term corresponds to the difference between the quantity of compensation of the RF input waveform which is acquired by assuming that the RF input waveform is linear and the quantity of compensation of the RF input waveform which is acquired by considering the nonlinearity of the RF input waveform.

For example, the RF input waveform I'(t) and I''(t) determined by the equation (2) and (3) may be further corrected under the following equation (4-1) and equation (4-2) by using correction coefficients k(I), k'(I'), in which nonlinearity of the power Ip of the RF transmission pulse inputted to the RF amplifier 29A are reflected.

$$I'(t)=k\{I(t)\} \cdot I(t)/h(t); \quad (4\text{-}1)$$

$$I''(t)=k'\{I'(t)\} \cdot I'(t)/h'(t); \quad (4\text{-}2)$$

The coefficients k(I) and k'(I') can be determined based on the preliminarily measured data plotted like in FIG. 4, indicating the peak Op of the power of the RF transmission pulse outputted from the RF amplifier 29A per power Ip of the RF transmission pulse inputted to the RF amplifier 29A. For example, a curve shown in FIG. 4 can be acquired by performing polynomial fitting on each of the plotted data. Then, the correction coefficients k(I) and k'(I') are defined as a ratio of the peak Op of the actual output power of the RF transmission pulse under the influence of the nonlinearity (corresponding to a solid curve in FIG. 4) to the peak of the output power of the RF transmission pulse acquired by assuming that it is linear, respectively. Thus, the correction coefficients k(I) and k'(I') have a different value per RF input waveform I(t), I'(t), respectively.

The correction coefficients k(I) and k'(I') determined by the aforementioned manner for correcting the nonlinear component are stored in the compensation parameter table 40B as a lookup table (table data) related to the RF input waveform I(t) and I'(t).

Then, the RF output waveform compensation unit 40A compensates RF control waveforms of pulse sequences, reflecting the nonlinearity of the RF input waveform, which becomes one of the causes of the overshoot of the RF amplifier 29A.

In this compensation, the RF output waveform compensation unit 40A refers to the correction coefficients k(I) and k'(I') per RF input waveform I(t), I'(t) stored in the compensation parameter table 40B as compensation parameters, and uses the compensation parameter corresponding to e.g. the RF input waveform I(t) acquired in a prescan.

Figure 5:
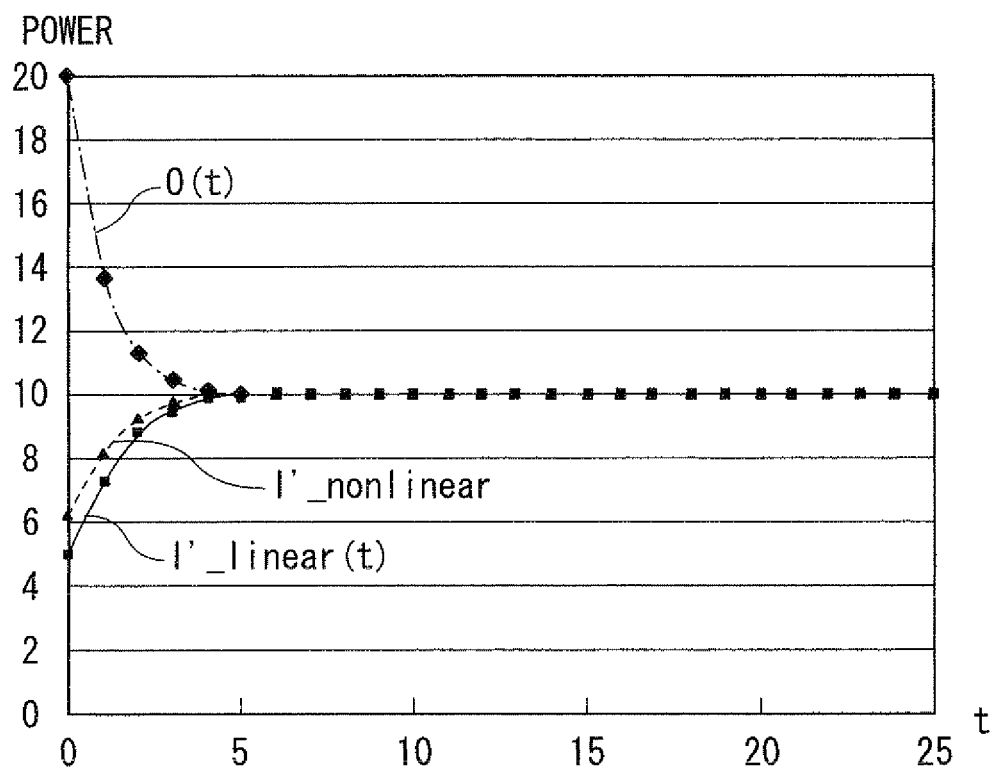
FIG. 5 is a chart showing an example of comparing a compensated RF control waveform reflecting responsive nonlinearity of an amplifier with a compensated RF control waveform without reflecting the nonlinearity.

FIG. 5 is a chart showing an example of comparing the compensated RF control waveform reflecting the responsive nonlinearity of the RF amplifier 29A with the compensated RF control waveform without reflecting the nonlinearity.

In FIG. 5, the abscissa axis indicates time (ms: milli-second), and the vertical axis indicates the power (kW) of the RF transmission pulse. When the RF input waveform I(t) to the RF amplifier 29A is a square-wave pulse of 10 kW (kilo-watt) and the RF input waveform I(t) is not compensated, the RF output waveform O(t) like the rhombic plots in FIG. 5 is outputted from the RF amplifier 29A and overshoot occurs.

Then, if the RF input waveform I(t) is compensated according to the equation (2) without reflecting the responsive non-linearity of the RF amplifier 29A (i.e. if I(t) is compensated by using only an inverse function), the RF input waveform I'_linear(t) after compensation like the tetragonal plots in FIG. 5 is acquired.

However, in order for the RF amplifier 29A to output a square-wave pulse of 10 kW, it is desirable in terms of accuracy to perform waveform compensation on the RF input waveform I(t) in the following method, according to the data indicating the responsive nonlinearity of the RF amplifier 29A. In this waveform compensation, the following response function is used. That is the response function in the case of the RF transmission pulse inputted to the RF amplifier 29A, indicating 6 kW in the abscissa axis in FIG. 4 corresponding to 10 kW in the vertical axis.

Then, if the RF input waveform I(t) is compensated using the correction coefficient k(I) shown in the equation (4-1), the responsive nonlinearity of the RF amplifier 29A is reflected and the RF input waveform I'_nonlinear(t) after compensation like the triangular plots in FIG. 5 is acquired. The correction coefficient k(I) in this case is acquired by referring to the compensation parameter table 40B.

Moreover, the RF control waveform can be compensated based on the RF output waveform and the response function acquired by performing a prescan again. In this prescan, the RF input waveforms k(I)×I(t), k'(I')×I'(t) acquired by correcting the RF input waveform I(t), I'(t) with the use of the correction coefficient k(I), k'(I') are used.

Note that not only correction coefficient k(I), k'(I') but also response functions related to RE input waveform I(t), I'(t) respectively, correction quantity and the RF input waveform I'(t), I"(t) after appropriate compensation acquired in the past can be stored in the compensation parameter table 40B as compensation parameters.

For example, compensation quantity of the RE control waveform according to an amplitude or a gradient of input waveform I(t), I'(t) can be determined without performing the aforementioned prescan. This can be achieved by preserving overshoot quantity corresponding to a gradient(amplitude/ms) of the input waveform I(t), I'(t) or correction quantity of the input waveformI(t), I'(t) in the compensation parameter table 40B.

Additionally, compensation of the RF control waveform can also be performed without performing the aforementioned prescan, when imaging conditions for the imaging scan are set. This can be achieved by storing the RF input waveform I'(t), I"(t) after compensation in the compensation parameter table 40B.

Such compensation of the RF control waveform can be performed on an RF transmission pulse having an intended waveform aside from a square-wave pulse such as a waveform under phase modulation.

Thus, the imaging condition setting unit 40 can set a pulse sequence in which a compensated RF transmission pulse with a drastic gradient(slope) having an intended waveform is applied. That is a waveform of an RF transmission pulse in a pulse sequence can be corrected by controlling the pulse sequence.

Figure 6:
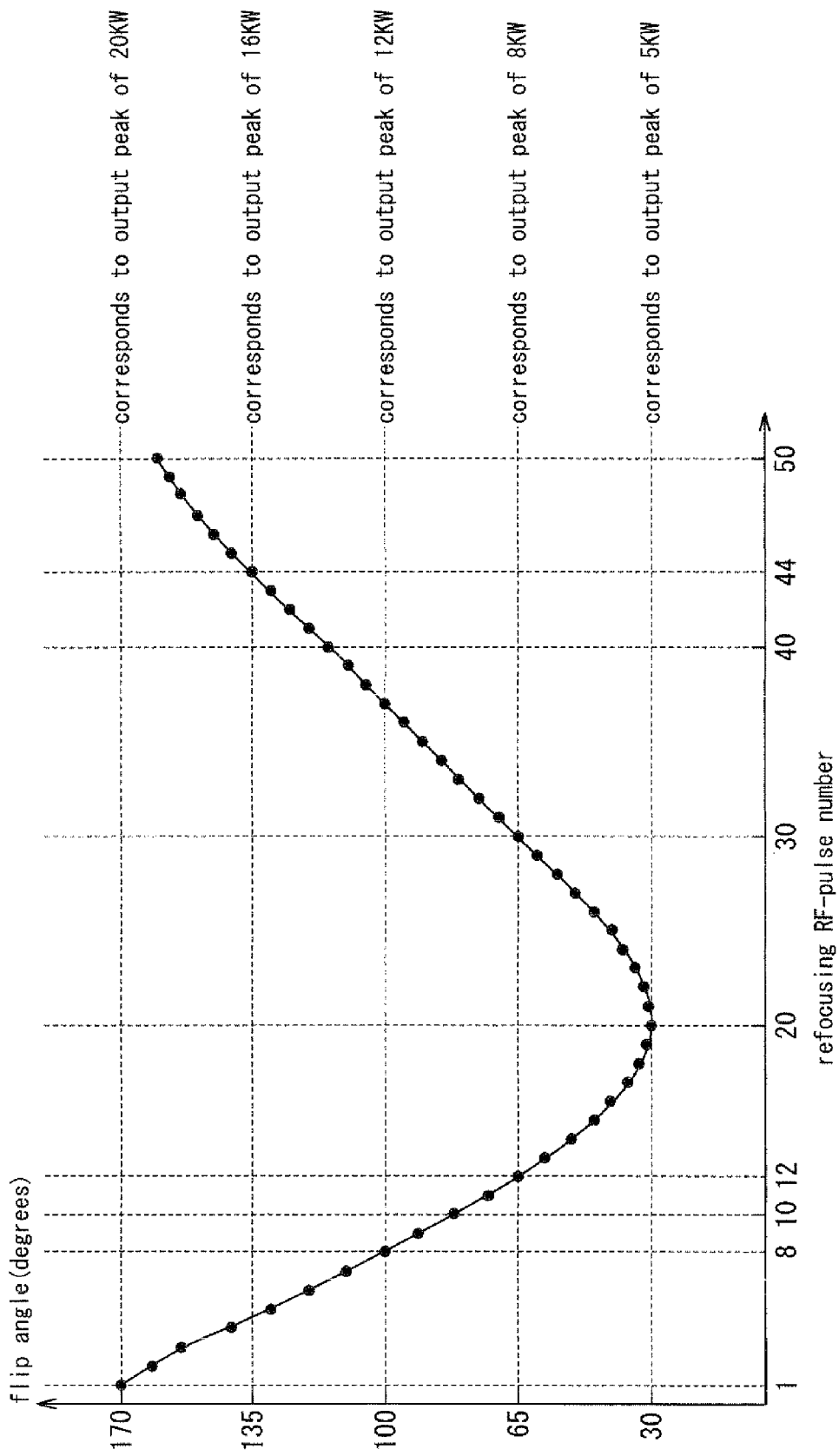
FIG. 6 is a chart showing an example of flip angles of a set of refocusing pulses transmitted after transmission of one RF pulse for excitation.

FIG. 6 is a chart showing an example of flip angles of a set of refocusing RF pulses transmitted after transmission of one RF pulse for excitation. In FIG. 6, the vertical axis indicates a flip angle of each refocusing pulse and the horizontal axis indicates the number of refocusing pulses (i.e. number of echoes).

A method of determining a curve (corresponding to the solid line in FIG. 4) defining non-linearity between power of the RF transmission pulse inputted to the RF amplifier 29A and peak power of the RF transmission pulse outputted from the RF amplifier 29A by using measured data will be explained with reference to FIG. 6.

In this embodiment, each refocusing pulse is transmitted as a square-wave pulse changing its flip angle, and measurement is performed around the transmission timing of each refocusing pulse, as an example. That is the power of the RF transmission pulse inputted to the RF amplifier 29A and the peak power of the RF transmission pulse outputted from the RF amplifier 29A are measured. Because measurement data are acquired as many as the number of the refocusing pulses, the aforementioned curve defining the non-linearity may be determined by using all the data. However, calculation time can be shortened by, for example, sampling from the entire measurement data in the following method and determining the curve defining the non-linearity.

Specifically, some of the entire measurement values are extracted at an equal interval in the vertical axis, so that the maximum and minimum values of flip angle are included. For example, in the case of using 5 values in FIG. 6, measurement values of electric power measured around the transmission timing of each refocusing pulse generating a flip angle of 30°, 65°, 100°, 135°, or 170° are used. If refocusing pulses giving flip angles of 30°, 65°, 100°, 135°, and 170° are transmitted in the phase of decreasing the flip angle from 170° to 30° (to the 20th refocusing pulse), these measurement values may be used (this is only an example).

However, in FIG. 6, a refocusing pulse giving a flip angle of 135° does not exist in the phase of decreasing the flip angle to 30°. In this case, if there is a refocusing pulse giving a flip angle of 135° in the phase of increasing the flip angle from 30°, the measurement value of this refocusing pulse may be used. That is, as an example in FIG. 6, the measurement values of the 1st, 44th, 8th, 12th and 20th refocusing pulses in the order of flip angle may be used.

In order to support the aforementioned explanation, an example of power values is shown in the right side of FIG. 6. When a square-wave pulse tilting a flip angle by 170° is transmitted as a refocusing pulse, its peak value of output electric power (i.e. the maximum electric power in the overshoot part) is, for example, 20 KW (kilo-watt). Then, by interpolating and fitting these 5 measurement values appropriately, a curve defining the non-linearity like the solid line in FIG. 4 can be preliminarily determined in a prescan.

Next, other functions of the computer 32 will be explained.

The sequence controller control unit 41 has a function of driving and controlling the sequence controller 31 by providing imaging conditions including a pulse sequence acquired from the imaging condition setting unit 40 to the sequence controller 31, in the case of receiving command information for starting a scan. Additionally, the sequence controller control unit 41 has a function of receiving raw data from the sequence controller 31 and arranging the raw data in k-space formed in the data processing unit 42.

The data processing unit 42 has a function of reconstructing image data by performing image reconstruction processing including FT (Fourier transformation) on the k-space data arranged in the k-space. The data processing unit 42 also has a function of generating 2 dimensional image data for display by performing necessary image processing on the image data acquired by the image reconstruction processing, and a function of making the display device 34 display images corresponding to the generated 2 dimensional image data for display.

(Operation and Behavior)

Next, the operation and the behavior of the magnetic resonance imaging apparatus 20 will be described. Here, the case of monitoring an RF output waveform in a prescan, and compensating an RF control waveform reflecting responsive non-linearity of the RF amplifier 29A based on the monitored RF output waveform will be explained. Note that it is possible to compensate the RF control waveform by referring to the compensation parameter table 40B without performing a prescan. It is also possible to compensate the RF control waveform without reflecting the responsive non-linearity of the RF amplifier 29A.

Figure 7:
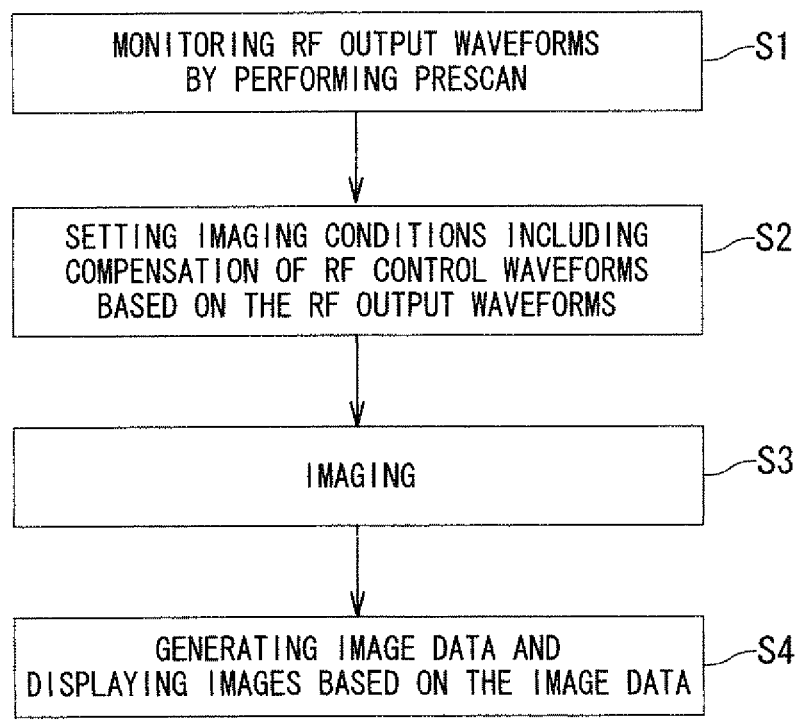
FIG. 7 is a flowchart showing a procedure of the magnetic resonance imaging apparatus 20 shown in FIG. 1 for imaging with compensation of the output waveform of the RF transmission pulse.

FIG. 7 is a flowchart showing a procedure of the magnetic resonance imaging apparatus 20 shown in FIG. 1 for imaging with compensation of the output waveform of the RF transmission pulse.

Firstly, in step S1, RF output waveforms from the RF amplifier 29A are monitored by performing a prescan.

That is a pulse sequence including an intended waveform as the RF control waveform such as a spatially non-selective square-wave pulse is set in the imaging condition setting unit 40. The pulse sequence set for the prescan is outputted from the imaging condition setting unit 40 to the RF amplifier 29A in the transmitter 29 via the sequence controller control unit 41 and the sequence controller 31.

Figure 3A:
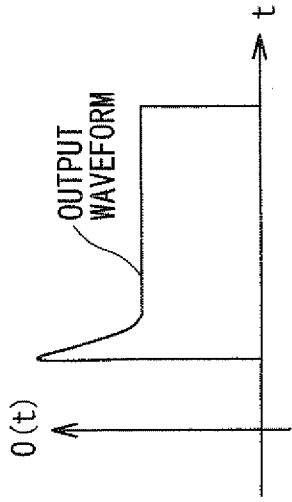
FIGS. 3A-D are concept charts showing examples of an RF input waveform to the RF amplifier 29A, an RF output waveform from the RF amplifier 29A corresponding to the RF input waveform, a compensated RE input waveform to the RF amplifier 29A, and an RF output waveform from the RF amplifier 29A corresponding to the compensated RF input waveform.
Figure 3B:
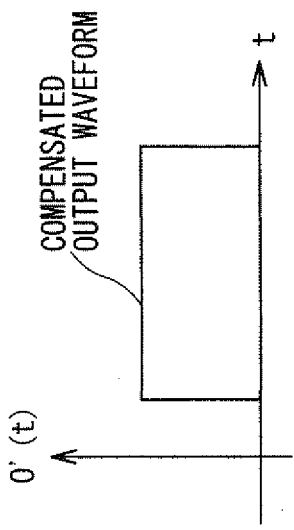
Figure 3C:
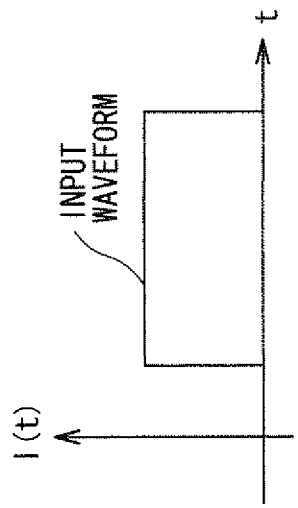
Figure 3D:
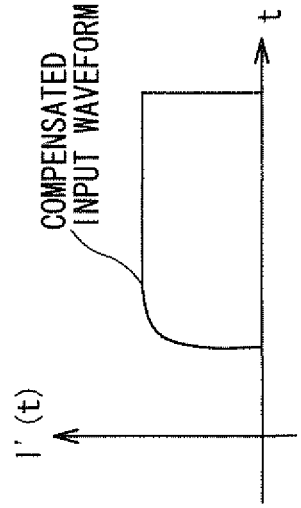

The RF amplifier 29A receives a spatially non-selective square-wave pulse like the one shown in FIG. 3(A) as the RF input waveform I(t), and outputs, for example, an RF output waveform O(t) like the one shown in FIG. 3(B). The RF output waveform O(t) is acquired in the RF output waveform compensation unit 40A, and is monitored in the RF output waveform compensation unit 40A.

In this embodiment, as an example, a prescan under the VFA method is performed. A set of refocusing RF pulses are transmitted as square-wave pulses by changing each flip angle, each time one RF pulse for excitation is transmitted. Then, the power of the RF transmission pulse inputted to the RF amplifier 29A and the peak power of the RF transmission pulse outputted from the RF amplifier 29A are measured around the transmission timing of each refocusing pulse.

Next, in step S2, imaging conditions for the imaging scan including the compensation of the RF control waveform based on the RF output waveform O(t) are set in the imaging condition setting unit 40.

That is the RF output waveform compensation unit 40A determines the RF input waveforms I'(t) and I"(t) based on the RF output waveform O(t), reflecting the responsive non-linearity of the RF amplifier 29A by using the equation (4-1) or (4-2).

Specifically, for example, the curve defining the non-linearity of ratio of output to input in the RF amplifier 29A is determined under the method explained with FIG. 6 based on measurement values in the prescan. In this process, the RF output waveform compensation unit 40A acquires correction coefficient k(I) and k'(I') necessary for the compensation by referring to the compensation parameter table 40B. Then, the imaging condition setting unit 40 sets a pulse sequence whose RF control waveforms are the RF input waveforms I'(t) and I"(t), as imaging conditions for the imaging scan.

Next, in step S3, the imaging scan is performed. Prior to the imaging scan, the object P is preliminarily set on the bed 37, and a static magnetic field is formed in the imaging region inside the static magnetic field magnet 21 (superconducting magnet) excited by the static magnetic field power supply 26. Additionally, electric current is supplied from the shim coil power supply 28 to the shim coil 22, thereby the static magnetic field formed in the imaging region is uniformed.

Next, when imaging start command is inputted from the input device 33 to the sequence controller control unit 41, the sequence controller control unit 41 inputs the imaging conditions including the pulse sequence obtained from the imaging condition setting unit 40 to the sequence controller 31. The sequence controller 31 drives the gradient magnetic field power supply 27, the transmitter 29 and the receiver 30 according to the pulse sequence obtained from the sequence controller control unit 41, so that a gradient magnetic field is formed in the imaging region where the object P is set and the RF coil 24 generates RF signals.

In the above processing, the RF transmission pulse transmitted from the RF coil 24 has a targeted(intended) waveform. This is because the compensated RF input waveforms I'(t) and I"(t) are inputted to the RF amplifier 29A, and the RF transmission pulse is generated according to the RF output waveforms O'(t) and O"(t) outputted from the RF amplifier 29A to the RF coil 24.

Then, NMR signals generated by nuclear magnetic resonance inside the object P are detected by the RF coil 24 and inputted to the receiver 30. The receiver 30 receives the NMR signals from the RF coil 24 and generates raw data by performing predetermined signal processing on the NMR signals and A/D conversion. The receiver 30 inputs the generated raw data to the sequence controller 31. The sequence controller 31 inputs the raw data to the sequence controller control unit 41, and the sequence controller control unit 41 arranges the raw data in the k-space formed in the data processing unit 42 (as k-space data).

Next, in step S4, the data processing unit 42 generates image data, and the display device 34 displays images corresponding to the generated image data. That is the data processing unit 42 reconstructs image data by performing image reconstruction processing on the k-space data arranged in the k-space, and generates image data for display by performing necessary image processing on the image data acquired by the image reconstruction processing. Then, the display device 34 displays images corresponding to the generated image data for display.

The images displayed through the above processing have more satisfactory contrast, because their image data are acquired according to the pulse sequence in which the RF control waveform is compensated so that the RF output waveform is transmitted with a precisely targeted waveform.

The magnetic resonance imaging apparatus 20 configured as described above compensates the RF control waveform per point based on the RF output waveform which is actually outputted from the RF amplifier 29A, and performs the imaging scan using the compensated RF control waveform.

Therefore, the magnetic resonance imaging apparatus 20 can monitor the RF output waveform outputted from the RF amplifier 29A by performing the prescan.

Additionally, the magnetic resonance imaging apparatus 20 can store the compensated RF control waveform and the RF output waveform outputted from the RF amplifier 29A in the compensation parameter table 40B.

Thus, the magnetic resonance imaging apparatus 20 can stably generate and transmit an RF transmission pulse with a precisely targeted waveform by compensating overshoot or undershoot in the RF amplifier 29A, even if the RF transmission pulse is a square-wave pulse or a phase-modulated waveform whose gradient is steep.

Additionally, the magnetic resonance imaging apparatus 20 can prevent application of an RF transmission pulse having an excess amplitude.

According to the aforementioned embodiment, an intended waveform of an RF output pulse can be generated more stably in MRI.

(Modifications)

In the aforementioned embodiment, an example of compensating the waveform of the RF transmission pulse by controlling a pulse sequence which is a software is explained. However, embodiments of this invention are not limited to such configuration. The RF transmission pulse can be compensated by controlling "hardware of transmission system" set at a phase prior to the RF amplifier 29A in terms of signal transmission flow.

Figure 8:
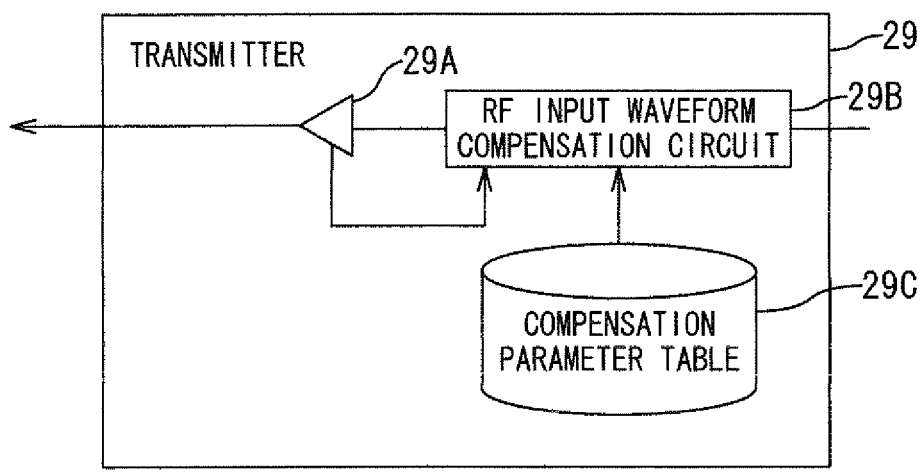
FIG. 8 is a chart showing an example of configuration of a transmitter when an RF input waveform to an RF amplifier is compensated by controlling hardware.

FIG. 8 is a chart showing an example of configuration of the transmitter 29, when the RF input waveform to the RF amplifier 29A is compensated by controlling hardware.

Inside the transmitter 29, an RF input waveform compensation circuit 29B is set at the phase prior to the RF amplifier 29A as shown in FIG. 8. Additionally, the RF input waveform compensation circuit 29B is electrically connected to a compensation parameter table 29C which stores compensation parameters like the compensation parameter table 40B shown in FIG. 2.

The RF input waveform compensation circuit 29B has a function of monitoring the RF output waveform before compensation outputted from the RF amplifier 29A and determining the compensated RF input waveform based on the monitored RF output waveform. The RF input waveform compensation circuit 29B also has a function of correcting the RF input waveform before compensation inputted from the sequence controller 31, so that the determined RF input waveform after compensation is inputted to the RE amplifier 29A.

Furthermore, the RF input waveform compensation circuit 29B compensates the RF input waveform reflecting the non-linearity of the RF input waveform to the overshoot component of the RF amplifier 29A, if necessary. This compensation is performed by referring to compensation parameters stored in the compensation parameter table 290 and using the appropriate compensation parameters.

Therefore, an RF transmission pulses with a precisely targeted waveform can be outputted like the aforementioned embodiment by setting the RF input waveform compensation circuit 29B in the phase prior to the RF amplifier 29A in signal transmission flow.

Note that a part of the function of the RF input waveform compensation circuit 29B in FIG. 8 and/or the compensation parameter table 290 may be set inside the computer 32.

In addition, embodiments of this invention are not limited to compensation of an RF control signal for a square-wave pulse which generates a spatially non-selective RF magnetic field. Regardless of spatially non-selective or spatially selective, embodiments of this invention are applicable to compensation of an RF control signal for an intended RE output waveform generating an RF magnetic field.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:

an MRI radio frequency (RF) transmitter amplifier circuit configured to controllably compensate an output waveform of an RF pulse from an amplifier during an MRI diagnostic data acquisition scan based on (a) a prior prescan output waveform of an RF pulse from said amplifier before compensation, said prior output from said amplifier having been generated in response to an intended waveform inputted to the amplifier during said prescan and (b) a response function acquired from said amplifier output during the prescan, so that an intended output waveform of an RF pulse for generating a spatially non-selective RF magnetic field is outputted from the amplifier during said MRI diagnostic data acquisition scan; and a generating unit that generates magnetic resonance image data based on magnetic resonance signals acquired during said MRI diagnostic data acquisition scan, wherein the amplifier circuit is configured to perform said compensation of the amplifier output RF pulse waveform plural times by using an input pulse waveform inputted to the amplifier and a response function acquired based on an output pulse waveform outputted from the amplifier according to the input pulse waveform.

2. The magnetic resonance (MRI) imaging apparatus according to claim 1, wherein the amplifier circuit is configured to include a digital data store which stores coefficients for correcting influence of non-linearity of the amplifier responsiveness, and to compensate the amplifier RF output pulse waveform using the stored coefficients.

3. The magnetic resonance imaging (MRI) apparatus according to claim 2, wherein the amplifier circuit is configured to compensate the amplifier RF pulse output waveform to decrease an overshoot component of the output RF pulse waveform and thereby more closely approximate a square-wave shaped pulse.

4. The magnetic resonance imaging (MRI) apparatus according to claim 1, wherein the amplifier circuit is configured to compensate the RF output pulse from the amplifier based on non-linearity of the amplifier responsiveness.

5. The magnetic resonance imaging (MRI) apparatus according to claim 4, wherein the amplifier circuit is configured to include a digital data store which stores coefficients for correcting influence of the non-linearity of the amplifier responsiveness, and to compensate the amplifier RF output pulse waveform using the stored coefficients.

6. The magnetic resonance imaging (MRI) apparatus according to claim 1,
wherein the amplifier circuit is configured to compensate the amplifier output RF pulse waveform for use in a VFA (variable flip angle) method of MRI.

7. The magnetic resonance imaging (MRI) apparatus according to claim 6,
wherein the amplifier circuit is configured to perform said prescan by (a) transmitting a plurality of refocusing RF pulses having mutually different flip angles, (b) measuring responsive non-linearity of the amplifier output for sampled ones of the plurality of refocusing pulses, and (c) compensating the RF pulse output waveform based on the measured result so that influence of the non-linearity in responsiveness of the amplifier is corrected.

8. The magnetic resonance imaging (MRI) apparatus according to claim 1,
wherein the amplifier circuit is configured to compensate the RF pulse output of the amplifier and transmit a square-wave pulse.

9. The magnetic resonance imaging (MRI) apparatus according to claim 1, wherein the amplifier circuit is configured:
to store at least one of (A) an amplifier output waveform of a radio-frequency wave before compensation, (B) a compensation quantity for a control waveform of a radio-frequency wave before compensation and (C) a control waveform of a radio-frequency wave after compensation, as a compensation parameter, and
to compensate the control waveform of a radio-frequency wave by referring to the compensation parameter.

10. The magnetic resonance imaging (MRI) apparatus according to claim 1,
wherein the amplifier circuit is configured to compensate a control waveform for a radio-frequency wave so that the amplifier outputs a square-wave pulse waveform.

11. The magnetic resonance imaging (MRI) apparatus according to claim 1,
wherein the amplifier circuit is configured to compensate a control waveform for a radio-frequency wave amplifier output to decrease an overshoot component of the output waveform of a square-wave radio-frequency pulse.

12. The magnetic resonance imaging (MRI) apparatus according to claim 1,
wherein the amplifier circuit is configured to compensate a control waveform for a radio-frequency wave amplifier output used as part of an MRI diagnostic data acquisition pulse sequence.

13. The magnetic resonance imaging (MRI) apparatus according to claim 1,
wherein the amplifier circuit is configured to compensate a control waveform for a radio-frequency wave amplifier output by use of different compensation settings for respectively corresponding different MRI diagnostic data acquisition pulse sequences.

14. A magnetic resonance imaging (MRI) method comprising:
controllably compensating an output waveform of a radio-frequency (RF) pulse from an RF amplifier during an MRI data acquisition scan based on a prior prescan output waveform of an RF pulse from said RF amplifier before compensation, generated in response to (a) an intended waveform inputted to the RF amplifier during said prescan and (b) a response function acquired from the RF amplifier output during the prescan, so that an intended output waveform of an RF pulse for generating a spatially non-selective RF magnetic field is outputted from the RF amplifier during an MRI diagnostic data acquisition scan; and
generating magnetic resonance image data based on magnetic resonance signals acquired during said MRI diagnostic data acquisition scan,
wherein said compensation of the RF amplifier output RF pulse waveform is performed plural times by using an input pulse waveform inputted to the RF amplifier and a response function acquired based on an output pulse waveform outputted from the RF amplifier according to the input pulse waveform.

* * * * *